United States Patent
Takeda et al.

(10) Patent No.: US 7,265,483 B2
(45) Date of Patent: Sep. 4, 2007

(54) DIELECTRIC MEMBER, PIEZOELECTRIC MEMBER, INK JET HEAD, INK JET RECORDING APPARATUS AND PRODUCING METHOD FOR INK JET RECORDING APPARATUS

(75) Inventors: Kenichi Takeda, Yokohama (JP);
Toshihiro Ifuku, Yokohama (JP);
Tetsuro Fukui, Yokohama (JP);
Hiroshi Funakubo, Kawasaki (JP);
Shoji Okamoto, Matsuyama (JP)

(73) Assignee: Canon Kabushiki kaisha, Tokyo (JP)

( * ) Notice: Subject to any disclaimer, the term of this patent is extended or adjusted under 35 U.S.C. 154(b) by 160 days.

(21) Appl. No.: 11/085,091

(22) Filed: Mar. 22, 2005

(65) Prior Publication Data

US 2005/0213020 A1    Sep. 29, 2005

(30) Foreign Application Priority Data

Mar. 29, 2004    (JP)    ............................. 2004-094597

(51) Int. Cl.
*H01L 41/047*    (2006.01)
(52) U.S. Cl. ...................................... 310/364; 310/363
(58) Field of Classification Search ............... 310/358, 310/363, 364
See application file for complete search history.

(56) References Cited

U.S. PATENT DOCUMENTS

| | | | |
|---|---|---|---|
| 6,943,485 B2 | 9/2005 | Sumi | ........................ 310/357 |
| 6,969,157 B2 | 11/2005 | Tomozawa et al. | |
| 7,033,521 B2* | 4/2006 | Iwashita et al. | ....... 252/62.9 R |
| 2003/0222943 A1 | 12/2003 | Sumi | ........................ 347/68 |
| 2003/0222948 A1* | 12/2003 | Higuchi et al. | ............... 347/70 |
| 2004/0053460 A1* | 3/2004 | Higuchi et al. | ............. 438/200 |
| 2005/0017269 A1* | 1/2005 | Miyazawa et al. | .......... 257/200 |
| 2005/0018019 A1* | 1/2005 | Miyazawa et al. | ............ 347/68 |
| 2005/0179342 A1 | 8/2005 | Higuchi et al. | |
| 2005/0280335 A1 | 12/2005 | Tomozawa et al. | |

FOREIGN PATENT DOCUMENTS

| | | |
|---|---|---|
| CN | 1461703 A | 12/2003 |
| JP | 8-116103 | 5/1996 |
| JP | 2003-179278 | 6/2003 |
| JP | 2003-243736 | 8/2003 |
| JP | 2004096050 A | 3/2004 |
| WO | 03098714 A1 | 11/2003 |

* cited by examiner

*Primary Examiner*—Thomas M. Dougherty
(74) *Attorney, Agent, or Firm*—Fitzpatrick, Cella, Harper & Scinto (57) ABSTRACT

A dielectric member including, on a substrate, a lower electrode, an oriented dielectric layer, and an upper electrode, in which at least either of the electrodes has an at least two-layered structure constituted of perovskite type oxide conductive layers, and has an orientation.

10 Claims, 8 Drawing Sheets

DIELECTRIC MEMBER, PIEZOELECTRIC MEMBER, INK JET HEAD, INK JET RECORDING APPARATUS AND PRODUCING METHOD FOR INK JET RECORDING APPARATUS

BACKGROUND OF THE INVENTION

1. Field of the Invention

The present invention relates to a dielectric member, a piezoelectric (electrostriction) member, and a producing method therefor, and more particularly to a dielectric member and a piezoelectric member applicable to a capacitor, a sensor, a transducer, an actuator and the like. It is particularly suitable for a ferroelectric memory which is recently attracting particular attention, a MEMS device or an ink jet head. Also the piezoelectric member is applicable, in addition to an ink jet head, to a memory head, an optical shutter and a speaker.

2. Description of Related Background Art

A dielectric material of a high specific dielectric constant is required for capacitors, while a thin layer formation of a ceramic material such as $BaTiO_3$ is progressing for obtaining compact capacitors. However a material such as $BaTiO_3$ or $Pb(Zr,Ti)O_3$ has a specific dielectric constant of about 1,500 at maximum in a ceramic material, and a thin layer formation may provide electronic devices of unsatisfactory characteristics due to an imperfect sintering or an interfacial structural defect.

There is recently investigated also an application of an (111) oriented PZT layer with a stable residual polarization to a memory. An example of preparing a (111) layer is described for example in Japanese Patent Application Laid-open No. 2003-179278. In this method, a (111)-oriented YSZ layer is formed as a buffer layer on a Si substrate, and $SrRuO_3$ (SRO) (111) is formed utilizing a lattice thereof, thereby obtaining a PZT(111) layer. This method is however associated with drawbacks that a formation of a buffer layer is required, that a stress control is required because a stress in the buffer layer influences the performance of the produced device, and that a layer of a tensile stress formed by such stress control is unable to stably grow the crystallinity of the SRO(111) layer thereon. Also such process, relying on an epitaxial growth, is poor in reproducibility. For avoiding these drawbacks, there is desired a monoaxially oriented layer of a uniform orientation, for which reproducible characteristics can be expected.

In the field of a piezoelectric member, owing to the recently expanding investigations for MEMS and piezoelectric applications, there is desired a piezoelectric element with satisfactory characteristics in a thin layer. The piezoelectric element is an element showing an extension/contraction when an electric field is applied between electrodes sandwiching a piezoelectric member, and is applicable to a motor, an ultrasonic motor, an actuator and the like.

A material utilized in these fields is a PZT material discovered about 50 years ago. A PZT material has a sintering temperature of 1100° C. or higher, and a material development is investigated for example by a sol-gel method, a sputtering method, an MBE method, a PLD method, a CVD method or the like for obtaining a thin layer device. However, a thin layer structure is associated with a drawback of easily causing a physical destruction in the layer or at the layer interface.

Therefore, it is being tried to obtain a layer of a large piezoelectric constant or a satisfactory voltage resistance. An example of utilizing a (001) oriented layer formed by sputtering in an ink jet head is described in Japanese Patent Application Laid-open No. H8-116103. In this method, an oriented electrode is provided on a substrate to control a crystalline structure of the piezoelectric layer. In this method, through a (001) oriented Pt electrode can be formed with a satisfactory crystallinity on a single crystal MgO substrate, there are involved drawbacks that the single crystal MgO substrate is expensive and is limited in the substrate size.

SUMMARY OF THE INVENTION

An object of the present invention is to provide a dielectric member, a piezoelectric member and an ink jet head of satisfactory characteristics, and an ink jet recording apparatus utilizing the same.

A dielectric member of the present invention includes, on a substrate, a lower electrode, a {100} oriented dielectric layer and an upper electrode wherein at least either of the electrodes has an at least two-layered structure of perovskite type oxide conductive layers, and has a {100} orientation.

Another embodiment of the dielectric member of the present invention includes, on a substrate, a lower electrode, a {100} oriented dielectric layer and an upper electrode wherein a fluorite type oxide layer is present between the lower electrode and the substrate and the lower electrode has at least two layers of a perovskite type {100} oxide conductive layer.

Another embodiment of the dielectric member of the present invention includes, on a substrate, a lower electrode, a {100} oriented dielectric layer and an upper electrode wherein at least either of the electrodes is formed by a spontaneous oriented metal layer and two or more of a perovskite type oxide conductive layer.

A piezoelectric member of the present invention is characterized in having at least a dielectric member of any of the aforementioned configurations. Also an ink jet head and an ink jet recording apparatus of the present invention are characterized in having at least a dielectric member of any of the aforementioned configurations.

A producing method of the present invention for producing a dielectric member includes a step of forming, on a substrate, a first perovskite type oxide electrode layer with a {100} orientation, a step of forming a second perovskite type oxide electrode layer with a {100} orientation, and a step of forming a {100} oriented dielectric layer, in this order.

Another embodiment of the producing method of the present invention for producing a dielectric member of the aforementioned configuration is characterized in that a following relation (1) is satisfied:

$$T2 \geq T3 \geq T1 \tag{1}$$

wherein T1 is a substrate temperature at the formation of the first oxide electrode layer, T2 is a substrate temperature at the formation of the second oxide electrode layer, and T3 is a substrate temperature at the formation of the dielectric layer.

Another embodiment of the producing method of the present invention for producing a dielectric member includes a step of forming, on a substrate, at least a fluorite type oxide layer, a step of forming a first {100} oriented conductive electrode layer principally constituted of a metal oxide under heating, a step of forming a second {100} oriented conductive layer, a step of forming a (001) oriented dielectric layer, and a step of forming an upper electrode, in this order.

Another embodiment of the producing method of the present invention for producing a dielectric member includes a step of forming, on a substrate, at least a spontaneous oriented metal layer, a step of forming a first {100} oriented conductive electrode layer principally constituted of a metal oxide under heating, a step of forming a second {100} oriented conductive layer, a step of forming a (001) oriented dielectric layer, and a step of forming an upper electrode, in this order.

The present invention relates to a producing method capable of forming, on an ordinary substrate, a {100} oriented or monoaxially oriented dielectric layer or a dielectric layer of a (001) epitaxial layer, a dielectric or piezoelectric member, an ink jet head and an ink jet recording apparatus obtained by such method. In particular the invention relates to a producing method realized by arbitrarily controlling a (001) preferential orientation, a monoaxial orientation and a single crystal layer, and a dielectric member, a piezoelectric member, and an ink jet head and an ink jet recording apparatus utilizing the same, obtained utilizing such method.

The present invention provides a layered structure of an oxide electrode for obtaining a {100} oriented dielectric layer or a (001) epitaxial oriented dielectric layer, and allows to obtain a dielectric member, a piezoelectric member and an ink jet head of satisfactory characteristics, and an ink jet recording apparatus utilizing the same.

DETAILED DESCRIPTION OF THE PREFERRED EMBODIMENTS

Now there will be given an explanation on a dielectric member and a piezoelectric member of the present invention.

The present invention provides a dielectric member including, on a substrate, at least a lower electrode, a {100} oriented dielectric layer and an upper electrode wherein at least either of the electrodes has an at least two-layered structure of perovskite type oxide conductive layers, and having a {100} orientation. There is also provided an aforementioned dielectric member in which the dielectric layer is an $ABO_3$ type perovskite oxide. Such configuration allows to obtain a dielectric layer of a {100} orientation with satisfactory orientability.

In another embodiment, the present invention provides a dielectric member including, on a substrate, at least a lower electrode, a {100} oriented dielectric layer and an upper electrode wherein a fluorite type oxide layer is present between the lower electrode and the substrate and the lower electrode has at least two perovskite type {100} oxide conductive layers.

The fluorite type oxide is for example $AmO_2$, $CeO_2$, $CmO_2$, $K_2O$, $Li_2O$, $Na_2O$, $NpO_2$, $PaO_2$, $PuO_2$, $RbO_2$, $TbO_2$, $ThO_2$, $UO_2$, or $ZrO_2$, and is preferably $CeO_2$ or $ZrO_2$, and has a (100) orientation. $ZrO_2$ may contain a rare earth element as a dopant. The fluorite type oxide layer is preferably present in two or more layers, but may also be present in one layer.

There is also provided an aforementioned dielectric member in which the dielectric layer has a (001) orientation.

Also in another embodiment, the present invention provides a dielectric member including, on a substrate, at least a lower electrode, a {100} oriented dielectric layer and an upper electrode wherein at least either of the electrodes is formed by a spontaneous oriented metal layer and two or more perovskite type oxide conductive layers.

Such configuration dispenses with a selection of the substrate and allows to obtain a {100} oriented layer, particularly a monoaxially oriented layer.

The metal of the spontaneous oriented metal layer has a face-centered cubic crystal structure, and is a dielectric member with a (111) orientation.

There is also provided a dielectric member in which the aforementioned {100} oriented dielectric layer has a (001) crystalline orientation degree of 50% or higher. The (001) crystalline orientation degree is preferably 80% or higher, and more preferably 99% or higher.

In the invention, there may be employed any metal material capable of forming a face-centered cubic crystal, such as Ni, Pt, Pb, Ir, Cu, Al, Ag or γ-Fe, preferably Pt or Ir. Formation of such spontaneous oriented layer allows, regardless of the crystallinity of the substrate, to form a dielectric layer of a {100} orientation, preferably a (001) orientation.

For improving the crystallinity of the dielectric layer, either of the two perovskite type oxide conductive layers is preferably formed by an oxide of $(Sr_x, Ca_y, Ba_z)RuO_3$ (wherein x+y+z=1) type.

It is more preferable that one of the two perovskite type oxide conductive layer is formed by an oxide containing at least Ni element. Such Ni-containing oxide is for example an oxide of $CNiO_3$ type in which C is at least one selected from La, Pr, Nd, Sm and Eu.

The present invention further provides a dielectric member in which one of the two perovskite type oxide conductive layer preferably has at least a rhombohedral structure. In order to facilitate a {100} orientation on a spontaneous oriented metal layer or a fluorite type oxide, the first perovskite type oxide conductive layer preferably has a rhombohedral structure. An oxide capable of easily assuming a rhombohedral structure includes the aforementioned Ni-containing oxide and a La-containing oxide to be explained later.

A La-containing oxide is preferably a compound in which La is contained in an A-site.

Also such compound may be employed as a second perovskite type oxide conductive layer. Examples of the oxide containing La in the A-site include $LaMoO_3$, $LaCoO_3$, $LaCrO_3$, $LaAlO_3$, $LaSrCoO_3$, $LaCuO_3$, $LaSrMnO_3$, $CaLaMnO_3$, $LaCaRhO_3$, $LaSrRhO_3$, and $LaBaRhO_3$.

Such perovskite type oxide conductive layer, used in a combination of two or more layers, allows to obtain a dielectric layer of {100} orientation, preferably (001) orientation, with a satisfactory reproducibility.

Such perovskite type compound, including the dielectric layer, is represented by a composition $ABO_3$, but such composition need not necessarily correspond exactly to 1:1:3 but a composition modified within a range not deteriorating the characteristics is also included in the present invention. For example the perovskite type oxide conductive layer may be poor in oxygen within a range not significantly affecting the conductivity and the crystallinity, or may be rich in the A-site element for improving the characteristics. A range of such composition modification is not particularly defined, but a modification within a range of ±10% may occur depending on the producing method.

The present invention further provides a piezoelectric member having the aforementioned dielectric layer, also an ink jet head including such piezoelectric member, and also an ink jet recording apparatus utilizing such ink jet head. Further, the present invention provides an ink jet head characterized in including at least the aforementioned piezoelectric member. The ink jet head of the present invention has a satisfactory durability and a stable performance because of the presence of the aforementioned piezoelectric member.

Figure 1:
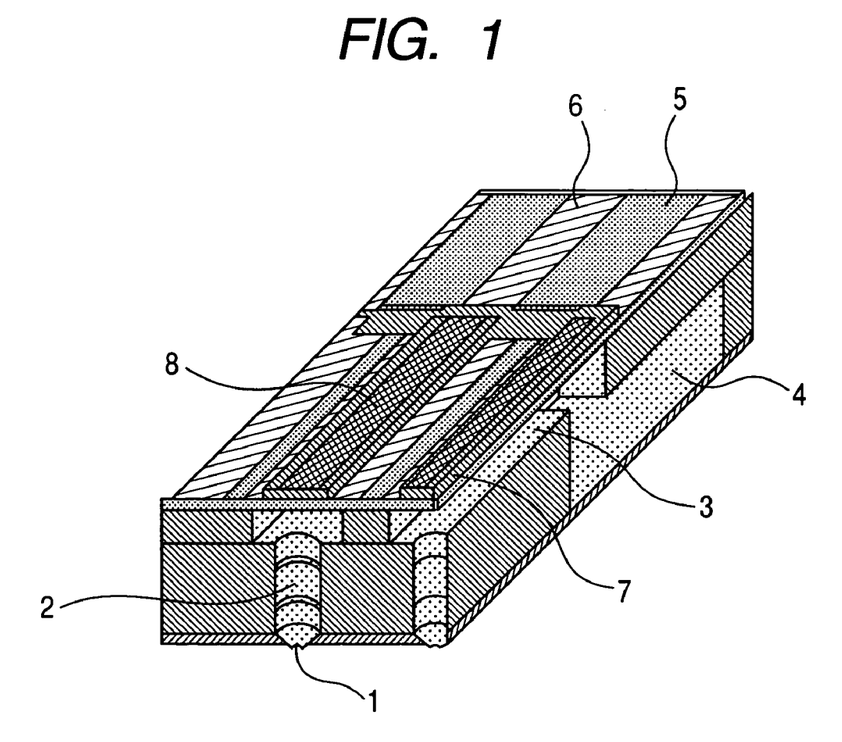
FIG. 1 is a schematic view of an ink jet head.
Figure 2:
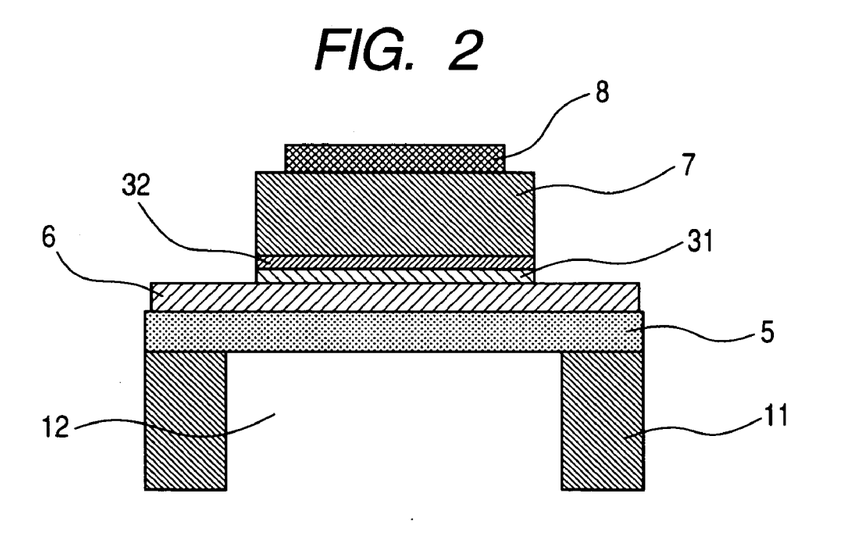
FIG. 2 is a cross-sectional view of a piezoelectric member.
Figure 3:
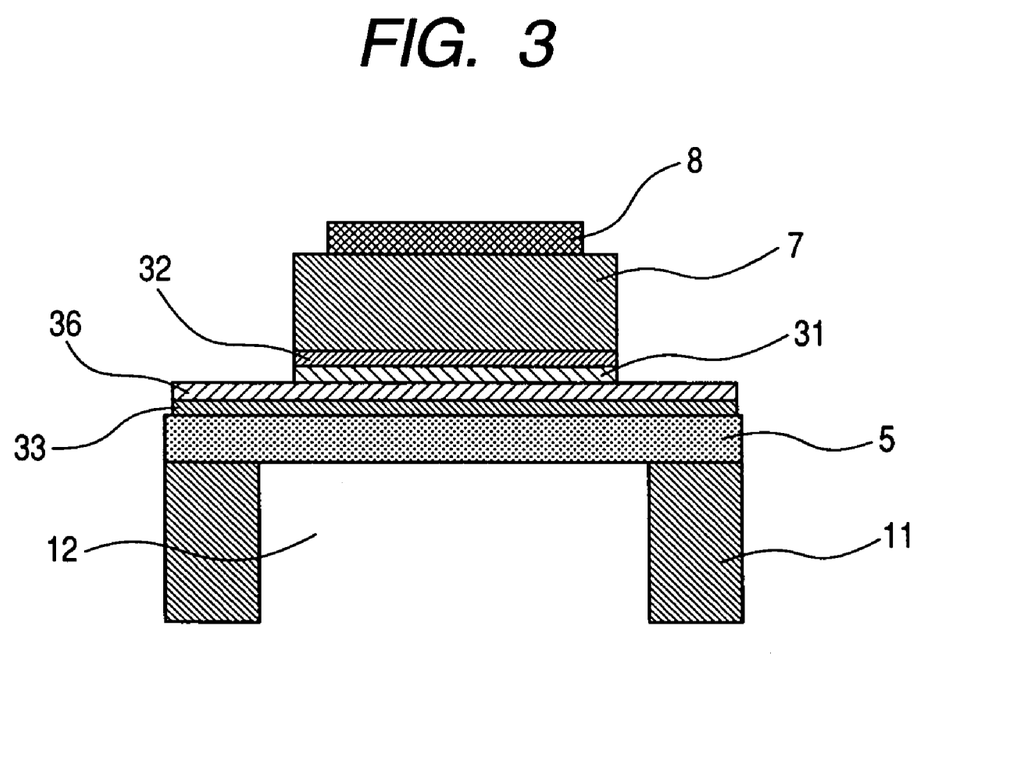
FIG. 3 is a cross-sectional view of a piezoelectric member.
Figure 4A:
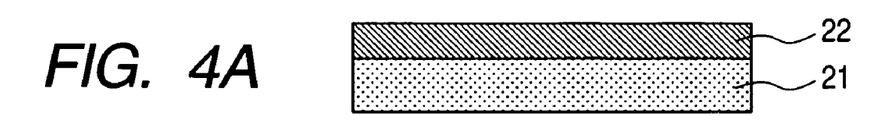
FIGS. 4A, 4B, 4C and 4D are schematic views showing steps for producing a dielectric member of the present invention.
Figure 4B:
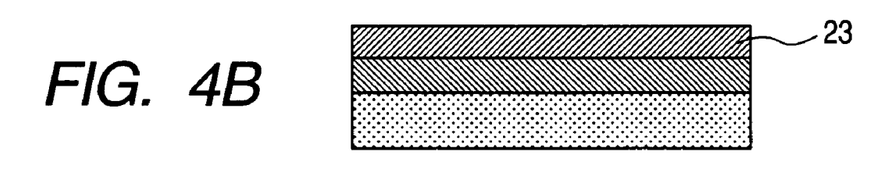
Figure 4C:
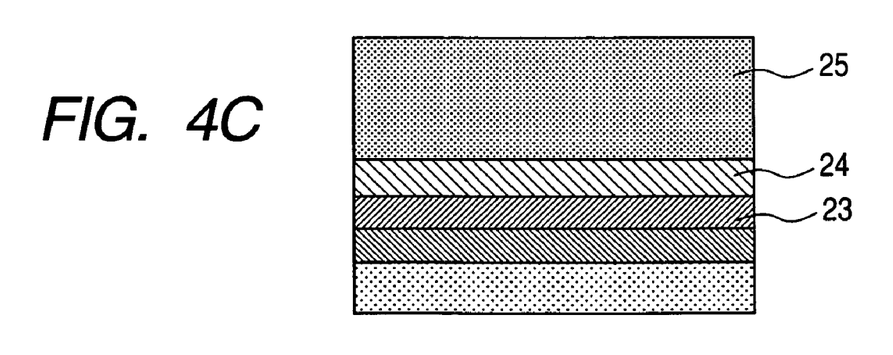
Figure 4D:
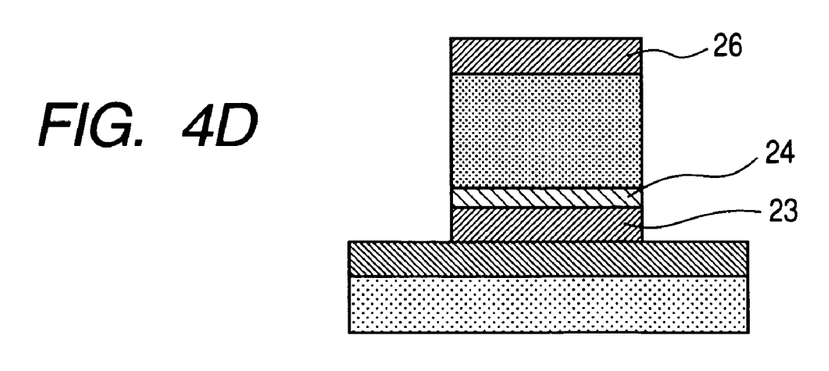

An ink jet head of the present invention will be explained with reference to FIGS. 1 and 2. FIG. 1 is a schematic view of an ink jet head, showing a discharge port 1, a communicating hole 2 connecting an individual liquid chamber 3 and the discharge port 1, a common liquid chamber 4, a vibration plate 5, a lower electrode 6, a piezoelectric layer 7, and an upper electrode 8. The piezoelectric layer 7 has a rectangular shape as illustrated. It may also be formed as an oval shape, a circular shape or a parallelogram shape. The piezoelectric layer 7 of the present invention will be explained further with reference to FIGS. 2 and 3, which are cross-sectional views of the piezoelectric layer in FIG. 1, in a transversal direction. FIG. 2 shows an example including a fluorite type oxide layer, and FIG. 3 shows an example including a spontaneous oriented metal layer. 31 and 32 indicate perovskite type oxide conductive layers of the invention, in which a layer 31 is a layer preferably containing a Ni-containing oxide and/or a rhobohedral structure. A layer 32 is preferably constituted of a $(Sr_x, Ca_y, Ba_z)RuO_3$ type oxide (wherein x+y+z=1), or a compound containing La in the A-site. A numeral 7 indicates a piezoelectric layer or a dielectric layer of a {100} orientation. Also there are shown a vibration plate 5, a fluorite type oxide layer 7 for controlling the orientation, and an upper electrode 8. In FIG. 2, the perovskite type oxide conductive layers 31, 32 are also patterned as in the piezoelectric layer, but they may also be formed as solid layers like the fluorite oxide layer 6. In FIG. 3, a spontaneous oriented metal layer 36 has a (111) orientation. On such (111) oriented layer, the perovskite type conductive layer 31 can be formed with a (100) orientation by selecting the aforementioned material. In a preferred embodiment, an anchor layer 33 is provided between the spontaneous oriented metal layer and the vibration plate 5 (or substrate). The anchor layer is preferably constituted of a metal such as Ti, Cr, Pb or Ni, or an oxide such as $TiO_2$. The anchor layer has a thickness of 0.5-50 nm, preferably 1-20 nm. Also the anchor layer may be formed by laminating the aforementioned materials. The upper electrode may be constituted of a multi-layered structure of a first perovskite type oxide conductive layer and a second perovskite type oxide conductive layer, or of a metal layer, or a laminated structure of a metal layer and a metal oxide layer. Films 7, 31 and 32 have a rectangular cross-sectional shape, but they may also have a trapezoidal or inverted trapezoidal shape. Also the layers 8, 31 and 32 may be laminated vertically in an inverted order. More specifically, it is possible to form the upper electrode by the layers 31, 32 in an order of 7 (piezoelectric layer)/32 (second electrode layer)/31 (first electrode layer). Such inverted structure arises from a device manufacturing process, and can still provide the advantages of the present invention.

The first electrode layer 31 and the second electrode layer 32, or the first electrode layer 31, constituting the lower electrode, is extended to an area where the piezoelectric layer 7 is not present, while the upper electrode is extended to an opposite side (not shown) to the lower electrode, and these electrodes are connected to a driving power source.

Examples of the layer structure other than the dielectric layer of the invention are shown in the following.

(1) $SrRuO_3$ (100)/$LaNiO_3$ (100)/Pt (111)/$TiO_2$/$SiO_2$/Si
(2) $SrRuO_3$ (100)/$LaNiO_3$ (100)/Ir (111)/$TiO_2$/$SiO_2$/Si
(3) $CaRuO_3$ (100)/$LaNiO_3$ (100)/Pt (111)/Ti/$SiO_2$/Si
(4) $SrRuO_3$ (100)/$LaNiO_3$ (100)/Pt (111)/$TiO_2$/SUS
(5) $CaRuO_3$ (100)/$LaNiO_3$ (100)/Ir (111)/Ti/$SiO_2$/Si
(6) $CaRuO_3$ (100)/$LaNiO_3$ (100)/$IrO_2$ (111)/Ir (111)/$TiO_2$/$SiO_2$/Si
(7) $SrRuO_3$ (100)/$LaNiO_3$ (100)/$IrO_2$ (111)/Ir (111)/$TiO_2$/$SiO_2$/Si
(8) $SrRuO_3$ (100)/$LaCoO_3$ (100)/Pt (111)/$TiO_2$/$SiO_2$/Si
(9) $SrRuO_3$ (100)/$LaSrCoO_3$ (100)/Pt (111)/$TiO_2$/$SiO_2$/Si
(10) $CaRuO_3$ (100)/$LaSrCoO_3$ (100)/Pt (111)/$TiO_2$/$SiO_2$/Si
(11) $SrRuO_3$ (100)/$LaNiO_3$ (100)/$CeO_2$ (100)/YSZ (100)/Si (100)
(12) $CaRuO_3$ (100)/$LaNiO_3$ (100)/$CeO_2$ (100)/YSZ (100)/Si (100)
(13) $SrRuO_3$ (100)/$LaCoO_3$ (100)/$CeO_2$ (100)/YSZ (100)/Si (100)
(14) $LaSrRuO_3$ (100)/$LaNiO_3$ (100)/$CeO_2$ (100)/YSZ (100)/Si (100)
(15) $SrRuO_3$ (100)/$LaNiO_3$ (100)/YSZ (100)/Si (100)
(16) $CaRuO_3$ (100)/$LaNiO_3$ (100)/YSZ (100)/Si (100)
(17) $SrRuO_3$ (100)/$LaCoO_3$ (100)/YSZ (100)/Si (100)
(18) $SrRuO_3$ (100)/$LaNiO_3$ (100)/$CeO_2$ (100)/YSZ (100)/Si (110).

The present invention is not limited to the aforementioned layer structures, but these structures represent preferable configurations. A dielectric layer formed thereon with a material to be explained later becomes a layer of a {100} orientation, preferably a (001) orientation.

In the ink jet head of the present invention, the vibration plate is constituted of a material with a Young's modulus of 50 Gpa or higher, preferably 60 Gpa or higher, such as $SiO_2$, SiN, SiNO, $ZrO_2$ (which may contain a stabilizing element), Si (which may contain a dopant), SUS, Ti, Cr, Ni or Al. In case of employing an epitaxial dielectric layer as the piezoelectric member, it is preferable to utilize the fluorite type oxide layer as a part of the vibration plate.

In the ink jet head of the present invention, the vibration plate 5 has a thickness of 0.5-10 μm, poreferably 1.0-6.0 μm. Also the electrode has a thickness of 0.05-0.6 μm, preferably 0.08-0.3 μm. Within this, the first perovskite type oxide conductive layer has a thickness of 5-450 nm, preferably 10-200 nm, and the second perovskite type oxide conductive layer has a thickness of 5-350 nm, preferably 10-150 nm. The spontaneous oriented metal layer has a thickness of 10-400 nm, preferably 30-200 nm.

The individual liquid chamber 12 has a width Wa (cf. FIG. 6) of 20-180 μm, a length Wb (cf. FIG. 6) of 0.3-6.0 mm depending also on an amount of a discharged liquid droplet. The discharge port 1 has a circular shape or a star-like shape with a diameter preferably of 7-40 μm. The discharge port preferably has a tapered cross-sectional shape enlarged toward the communicating hole 2. The communicating hole 2 has length preferably within a range of 0.05 to 0.5 mm. A length exceeding this range may reduce a discharge speed of the liquid droplet. Also a length less than this range may increase a fluctuation in the discharge speed of the liquid droplets from the discharge ports.

The present invention also provides an ink jet recording apparatus utilizing the aforementioned ink jet head.

Figure 8:
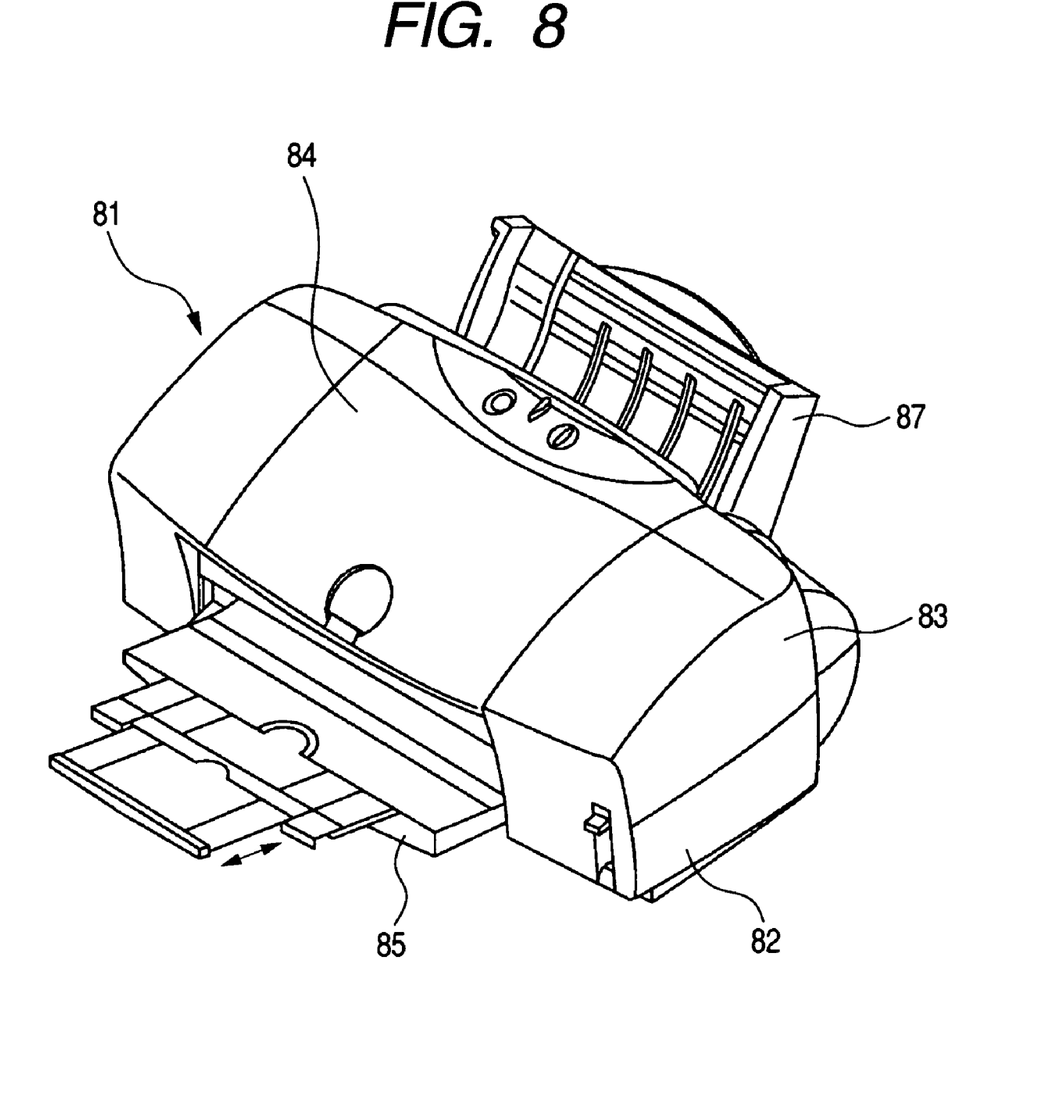
FIG. 8 is a schematic view of an ink jet recording apparatus.
Figure 9:
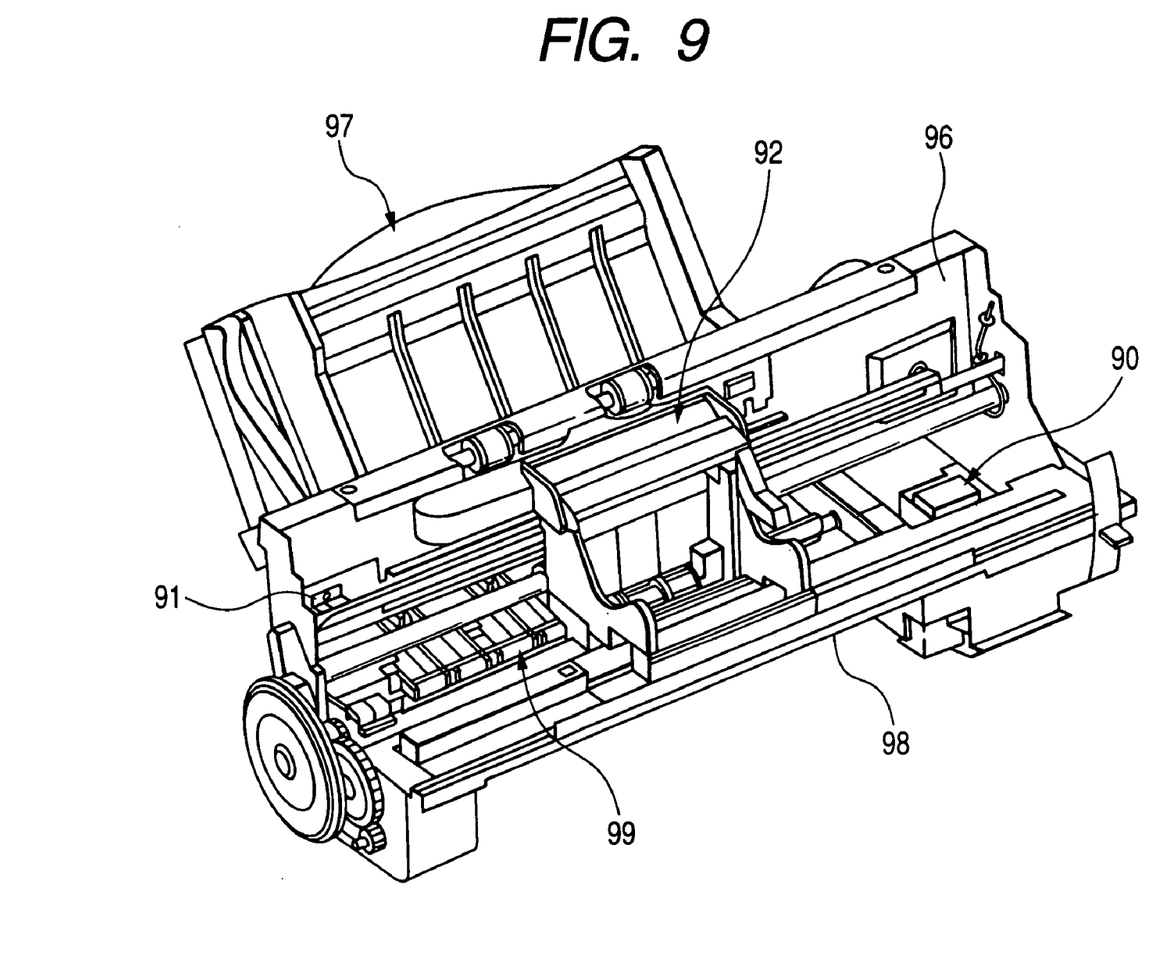
FIG. 9 is a schematic view of an ink jet recording apparatus without an outside casing.

The present invention thus allows to obtain an ink jet head of a long service life with stable discharge characteristics, and to obtain an ink jet recording apparatus of satisfactory performance. FIGS. 8 and 9 are schematic views of an ink jet recording apparatus utilizing an ink jet head of the present invention. FIG. 9 shows an operational mechanism, without an outer casing shown in FIG. 8. The mechanism is constituted of an automatic feeder portion 97 for automatically feeding a recording sheet, constituting a recording medium, into a main body of the apparatus, a conveying portion 9 for guiding the recording sheet, supplied from the automatic feeder portion 97, to a predetermined recording position and also guiding the recording sheet from the recording position to a discharge port 98, a recording portion for executing a recording on the recording sheet conveyed to the recording position, and a recovery portion 90 for executing a recovery process on the recording portion. The ink jet head of the present invention is used by mounting on a carriage 92. FIG. 8 shows an example as a printer, but the present invention is applicable also to a facsimile, a multifunction apparatus, a copying apparatus or an industrial discharge apparatus.

The present invention provides a method for producing a dielectric member including at least a step of forming, on a substrate, a first perovskite type oxide electrode layer with a {100} orientation, a step of forming a second perovskite type oxide electrode layer with a {100} orientation, and a step of forming a {100} oriented dielectric layer.

By forming the oxide electrode at the side of the dielectric layer with the aforementioned $(Sr_x, Ca_y, Ba_z)RuO_3$ type oxide (wherein x+y+z=1), the dielectric layer can be formed with a {100} orientation, preferably a (001) orientation.

The present invention also provides a producing method which satisfies a following relation (1):

$$T2 \geq T3 \geq T1 \quad (1)$$

wherein T1 is a substrate temperature at the formation of the first oxide electrode layer, T2 is a substrate temperature at the formation of the second oxide electrode layer, and T3 is a substrate temperature at the formation of the dielectric layer.

Such method allows to obtain a satisfactory control on the crystallinity of the dielectric layer and to maintain satisfactory characteristics after the formation of the dielectric layer. Specific range of the substrate temperature is 250-500° C. for T1, 400-850° C. for T2, and 400-700° C. for T3. In case of forming a memory device such as an FRAM, these temperatures are preferably selected lower for reducing restrictions on other materials. In particular, the temperature T3 for forming the dielectric layer is preferably 600° C. or lower. A method satisfying the condition (1) reduces the detrimental effects on the dielectric device or the piezoelectric device and allows to obtain layer and devices of satisfactory crystallinity.

Also the present invention provides a method for producing a dielectric member including at least a step of forming, on a substrate, at least a fluorite type oxide layer, a step of forming a first {100} oriented conductive electrode layer principally constituted of a metal oxide under heating, a step of forming a second {100} oriented conductive layer, a step of forming a (001) oriented dielectric layer, and a step of forming an upper electrode.

This method allows to obtain a (001) epitaxial layer. The substrate is preferably formed by a Si substrate, more preferably a (100) substrate.

The fluorite type oxide layer preferably has a (100) orientation. Also it preferably has a two-layered structure. The fluorite type oxide is preferably selected from the aforementioned materials. In case the fluorite type oxide layer has a two-layered structure, it is preferable to form a $ZrO_2$ layer doped with Y or Pr on a Si (100) substrate and to form a $CeO_2$ layer thereon.

The present invention further provides a method for producing a dielectric member including a step of forming, on a substrate, at least a spontaneous oriented metal layer, a step of forming a first {100} oriented conductive electrode layer principally constituted of a metal oxide under heating, a step of forming a second {100} oriented conductive layer, a step of forming a (001) oriented dielectric layer, and a step of forming an upper electrode.

In such case, the substrate can be, in place for a Si substrate, a substrate with a random crystallinity such as SUS, inconel, a Ti foil or a Ni foil. Also the Si substrate can be, in addition to the (100) substrate mentioned above, a (110) substrate or a (111) substrate.

The present invention further provides a method for producing an ink jet head including a step of forming, on a substrate, at least a spontaneous oriented metal layer, a step of forming a first {100} oriented conductive electrode layer principally constituted of a metal oxide under heating, a step of forming a second {100} oriented conductive layer, a step of forming a (001) oriented dielectric layer, a step of forming another electrode, a step of forming plural individual liquid chambers constituting pressure chambers, and a step of forming discharge ports for liquid discharge.

The spontaneous oriented metal layer is preferably constituted of a metal of a face-centered cubic crystal structure, of specific examples shown above. In this manner a (111) oriented layer can be formed regardless of the material and the crystallinity of the substrate, and a {100} layer can be formed thereon.

The present invention further provides a method for producing an ink jet head including at least a step of forming, on a substrate, a fluorite type oxide layer, a step of forming a first {100} oxide conductive, a step of forming a second {100} oxide conductive layer, a step of forming a (001) oriented dielectric layer, a step of forming another electrode, a step of forming plural individual liquid chambers constituting pressure chambers, and a step of forming discharge ports for liquid discharge.

The producing method for the ink jet head of the invention may be a method of forming an individual liquid chamber in a substrate in which the dielectric layer is formed, or a method of transferring a structure of the piezoelectric member to another substrate in which an individual chamber is formed or is to be formed.

The dielectric layer of the present invention is preferably constituted of a perovskite type compound. Use of such perovskite type compound enables a layer formation with satisfactory control of crystallinity on the perovskite type oxide conductive layer. A material employed as the dielectric layer, is for example an $ABO_2$ type compound, for example a piezoelectric material such as lead titanate zirconate PZT $[Pb(Zr_xTi_{1-x})O_3]$ or barium titanate $BaTiO_3$, or an electrostriction material of relaxer type. The lead titanate zirconate PZT preferably has a MPB (morphotropic phase boundary) composition having an x value from 0.40 to 0.65, but other compositions are also usable. The PZT may have a tetragonal or rhombohedral structure. There is particularly preferred a thin layer in which a tetragonal structure and a rhombohedral structure are mixed. $BaTiO_3$ is preferably used as a layer of a tetragonal structure with a (001) orientation. Also $BaTiO_3$ may contain a trace amount of lead, bismuth, iron or potassium.

An electrostriction material may be employed in the dielectric layer, and can be selected for example from PMN $[Pb(Mg_xNb_{1-x})O_3]$, PNN $[Pb(Nb_xNi_{1-x})O_3]$, PSN $[Pb(Sc_xNb_{1-x})O_3]$, PZN $[Pb(Zn_xNb_{1-x})O_3]$, PMN-PT $[(1-y)[Pb(Mg_xNb_{1-x})O_3]-y[PbTiO_3]]$, PSN-PT $[(1-y)[Pb(Sc_xNb_{1-x})O_3]-y[PbTiO_3]]$, PZN-PT $[(1-y)[Pb(Zn_xNb_{1-x})O_3]-y[PbTiO_3]]$, LN $[LiNbO_3]$ and KN $[KNbO_3]$, wherein x and y represent a number within a range from 1 to 0. For example, x is preferably 0.2-0.5 for PMN and 0.4-0.7 for PSN, and y is preferably 0.2-0.4 for PMN-PT, 0.35-0.5 for PSN-PT and 0.03-0.35 for PZN-PT. There can also be employed PMN-PZT, PZN-PZT, PNN-PZT or PSN-PZT, which is formed by substituting Ti with Zr in PMN-PT, PZN-PT, PNN-PT or PSN-PT.

The piezoelectric or electrostriction layer may have a single composition or may be formed by a combination of two or more compositions. Also a composition in which the aforementioned principal components include a trace amount of a doping element. The dielectric layer of the present invention is preferably controlled in the crystallinity for exhibiting an excellent piezoelectric property, and preferably contains a specified orientation of a specified crystal structure by 50% or more in an X-ray diffraction, more preferably 80% or more and particularly preferably 99% or more.

The electrode layer and the dielectric layer are formed for example by a sputtering method, an MO-CVD method, a laser ablation method, a sol-gel method or an MBE method, preferably by a sputtering method, an MO-CVD method, or a sol-gel method or, and more preferably by an MO-CVD method or a sputtering method.

On a substrate 21 (FIGS. 4A to 4D), a spontaneous oriented metal layer 22 is formed preferably without heating or under a low-temperature heating of the substrate. Thus the metal layer is obtained without a large stress. For the spontaneous oriented layer, it is necessary, as explained in the foregoing, to select a metal material of a face-centered cubic crystalline structure having a heat resistance to a heating condition in subsequent steps. In FIGS. 4A to 4D, there are shown perovskite type oxide conductive layers 23, 24, a dielectric layer 25, and an upper electrode 26. In the present invention, there is preferably selected a metal layer of a face-centered cubic crystalline structure with a half-peak width of 0.1 to 10°. Also this step may be execute in two steps. The two-step method executes a first layer forming step under heating of the substrate, and then executes a layer formation without heating of the substrate, followed by an annealing. This method allows to obtain a spontaneous oriented metal layer having a crystallinity and a surface smoothness at the same time. In an MO-CVD layer forming method, as a condition other than the substrate temperature, it is preferable to employ a pulsed MO-CVD method, in which a raw material gas is supplied not continuously but intermittently onto the substrate.

In the following, there will be explained a method for producing the ink jet head of the present invention. The producing method of the present invention may be executed in two methods, namely a method of forming an individual liquid chamber, constituting a pressure chamber, in a substrate employed for forming the aforementioned dielectric member, and a method of forming an individual liquid chamber in another substrate.

Figure 5:
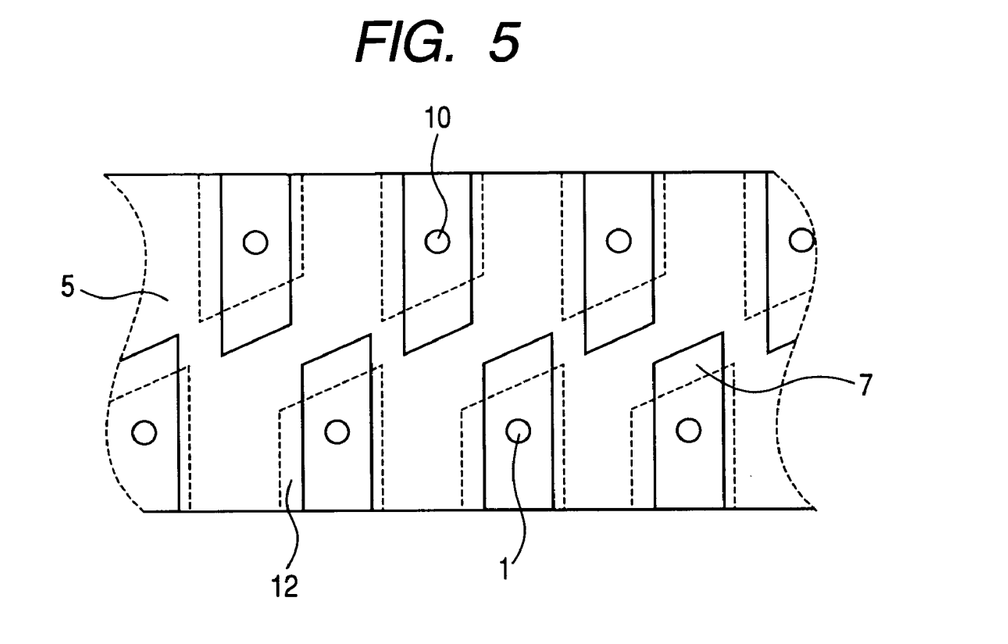
FIG. 5 is a plan view of an ink jet head.
Figure 6:
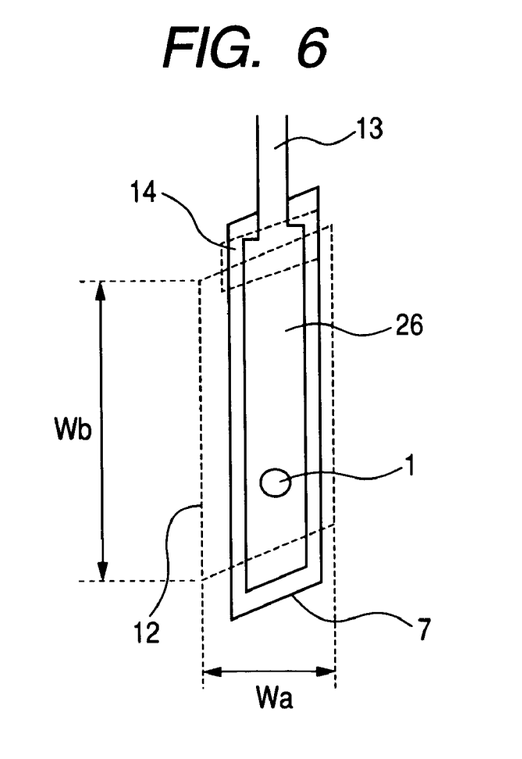
FIG. 6 is a plan view of an individual liquid chamber.

The former method is same as the producing method for the dielectric member up to the step of forming piezoelectric layer, and further includes at least a step of eliminating a part of the substrate 21 (FIGS. 4A to 4D), and a step of forming an ink discharge port. An individual liquid chamber (3 in FIG. 1 or 12 in FIG. 2) is formed by eliminating a part of the substrate. The individual liquid chamber can be formed by wet etching, dry etching or sand milling the substrate. The individual liquid chamber is formed in plural units on the substrate, with a predetermined pitch. As shown in FIG. 5, indicating a planar structure of the ink jet head, the individual liquid chambers are preferably arranged in a staggered arrangement. In FIG. 5, a broken-lined area 12 is an individual liquid chamber to be pressurized, and a patterned piezoelectric element portion 7 is also shown. The piezoelectric layer of this piezoelectric element portion is constituted at least of a dielectric layer of the present invention and an upper electrode. 5 indicates a vibration plate portion and a lower electrode. In the present invention, in case the dielectric layer is formed by a (001) epitaxial layer, a part of the vibration plate contains at least a fluorite type oxide layer. The upper electrode may be patterned, different from the vibration plate, as shown in FIGS. 4A to 4D. The electrode at least immediately under the dielectric layer has a laminated structure of a second perovskite type oxide conductive layer and a first perovskite type oxide conductive layer. FIG. 5 shows the individual liquid chamber in a parallelogram shape as a representative example, since such shape is obtained by employing a Si (110) substrate and by forming an individual liquid chamber by an alkaline wet etching. However, a rectangular shape or a square shape may also be adopted. In case of a parallelogram shape as shown in FIG. 5, the piezoelectric layer is preferably patterned in a parallelogram shape in order to reduce the distance between the discharge ports 1 and 10. FIG. 6 is a plan view of the entire individual liquid chamber, in which the upper electrode 26 is connected to a driving circuit utilizing an area 13 extended from the individual liquid chamber 12. A constricted portion 14 is provided in the flow path from the common liquid chamber to the individual liquid chamber, and the piezoelectric layer is extended to such portion in the configuration shown in FIG. 6, but such extension is not essential.

The ink discharge port is formed by adjoining a substrate provided with the discharge port 1, or by adjoining a substrate provided with the discharge port 1 and the communicating hole 2. The discharge port can be formed by an etching, a mechanical working or a laser irradiation. The substrate in which the discharge port is formed may be same as or different from the substrate on which the piezoelectric layer is formed. In case of using a different substrate, there can be selected for example a SUS substrate or a Ni substrate, and there is selected a material having a difference in the thermal expansion coefficient of 1E-6 to 1E-8/° C. from the substrate on which the piezoelectric layer is formed.

The adjoining of the substrate may be executed with an organic adhesive, but is preferably executed by a metallic adjoining utilizing an inorganic material. The metallic adjoining may be made for example with In, Au, Cu, Ni, Pb, Ti, Cr or Pd, which can achieve the adjoining at a low temperature of 300° C. or less, and can avoid a drawback of a bending of a long-sized device because of a smaller difference with the thermal expansion coefficient of the substrate and can also avoid damages to the piezoelectric layer.

Figures 7A, 7B:
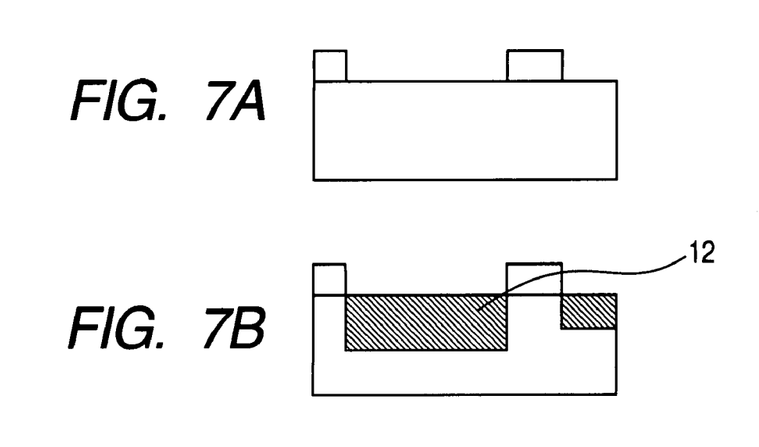
FIGS. 7A, 7B, 7C, 7D, 7E and 7F are schematic views showing second steps for producing a substrate of an ink jet head.
Figure 7C:
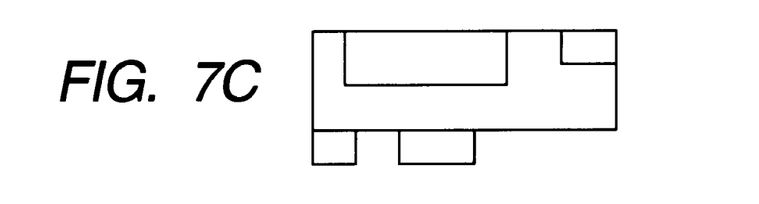
Figure 7D:
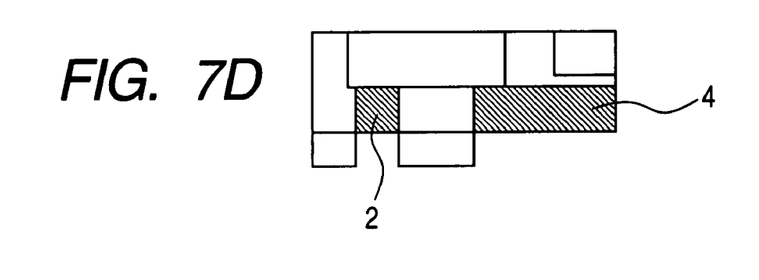
Figure 7E:
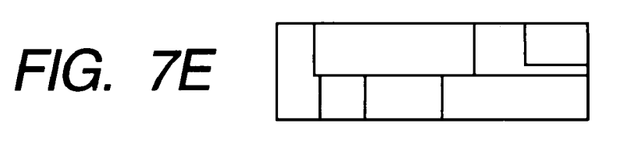
Figure 7F:
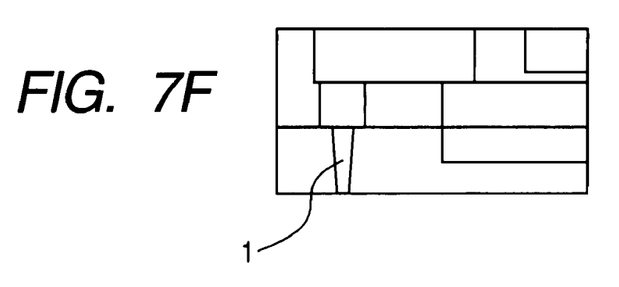

In the following there will be explained the second producing method, in which a piezoelectric (dielectric) layer formed on a first substrate is transferred onto a second substrate. The process is same as the method shown in FIGS. 4A to 4D up to the formation of the piezoelectric layer, but the vibration plate 5 is formed on the upper electrode in a state where the piezoelectric layer is not patterned, and a transfer onto the second substrate is executed. Otherwise, an electrode and/or a vibration plate is formed on the piezoelectric layer, then the vibration plate is adjoined to the second substrate and is transferred, together with the piezoelectric layer, to the second substrate. The second substrate is subjected, in steps of FIGS. 7A to 7E among those in FIGS. 7A to 7F, formations of an individual liquid chamber 12, a communicating hole 2 and a common liquid chamber 4. FIG. 7A shows a step of forming a mask corresponding to the individual liquid chamber on the second substrate; FIG. 7B shows a working step from above for example by etching (hatched portion indicating a worked portion); FIG. 7C shows a mask eliminating step and a step of forming a mask for the communicating hole 2; FIG. 7D shows a step of forming a communicating hole and a common liquid chamber by working a hatched portion for example by etching; and FIG. 7E schematically showing a state where the individual liquid chamber, the communicating hole and the common liquid chamber are used after mask elimination. FIG. 7F shows an adjoined state of a substrate bearing a discharge port and a part of a common liquid chamber. A substrate surface 16 bearing the discharge port (FIG. 11) is preferably subjected to a water repellent treatment.

Figure 11:
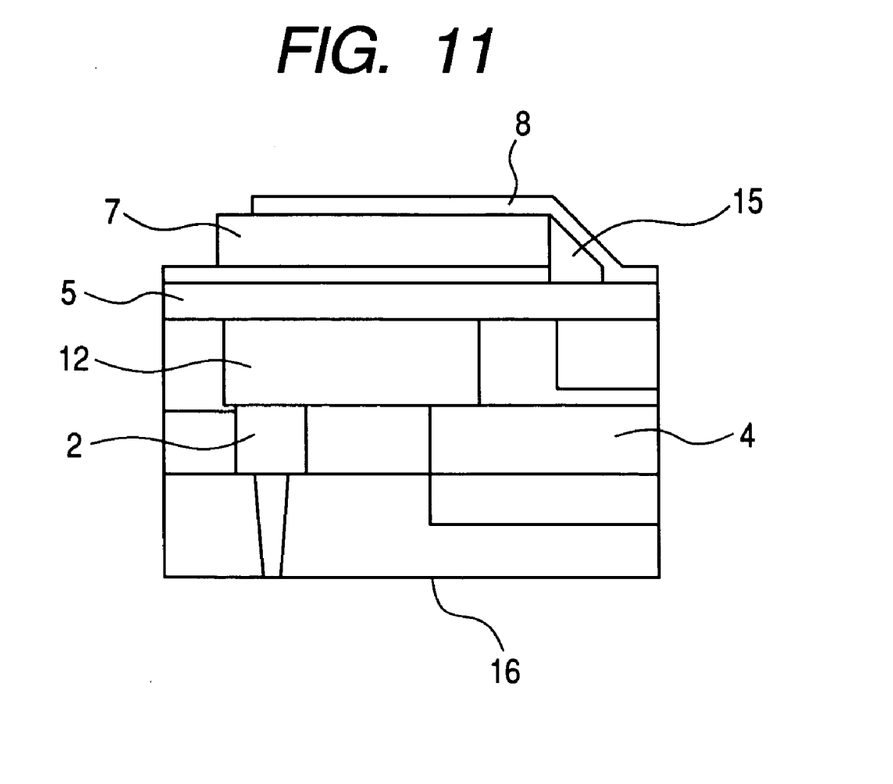
FIG. 11 is a cross-sectional view of an ink jet head in a longitudinal direction.

The second substrate to be adjoined to the piezoelectric layer of the first substrate is used in a state shown in FIG. 7E or FIG. 7F. In case the vibration plate is absent on the piezoelectric layer, there is utilized a second substrate having a vibration plate on the individual liquid chamber 12 in the state of FIG. 7E or 7F. FIG. 11 shows a state where, after the adjoining, the first substrate is eliminated and the piezoelectric layer is patterned. In FIG. 11, the upper electrode 8 is laminated in an order, from the side of the vibration plate 5, of a second perovskite type oxide conductive layer and a first perovskite type oxide conductive layer.

Also in case of forming a vibration plate on the second substrate, transferring a piezoelectric layer and eliminating the first substrate as described as a part of the latter method, the piezoelectric member may be in a patterned state or in an unpatterned state. In case of such process, the metal adjoining layer is preferably utilized as the lower electrode.

The producing method for the ink jet head of the present invention is characterized by the patterning of the piezoelectric layer and/or the elimination of the first substrate, and a spontaneous oriented metal layer, if present, is preferably utilized as an etching stop layer. Also a half-peak width within the aforementioned range provides little change in the stress before and after the elimination of the substrate and before and after the patterning of the piezoelectric layer, thereby providing advantages of reducing cracking, peeling, bending etc. Also these facts indicate that the method is applicable also to a large area substrate, and can achieve a cost reduction per device and an improvement in the production throughput. The method also provides similar effects in the patterning of the piezoelectric layer, thereby allowing to obtain a device showing little change in the characteristics from the layer forming step.

Also in case a fluorite type oxide layer is present, it can be utilized for controlling the stree thereby reducing drawbacks such as cracking, peeling, bending and the like.

EXAMPLES

In the following, the present invention will be clarified by examples.

Example 1

On a Si substrate bearing a thermal oxide $SiO_2$ layer of a thickness of 100 nm, a $TiO_2$ layer was formed, and Pt (111) was sputtered with a thickness of 100 nm at a substrate temperature of 300° C. The layer had a half-peak width of 0.46°. Then a $LaNiO_3$ (LNO) layer was formed by sputtering with a thickness of 100 nm at a substrate temperature of 300° C. The LNO layer had a rhombohedral structure. On the LNO layer, a $SrTiO_3$ (SRO) layer was formed with a thickness of 50 nm at a substrate temperature of 650° C. Then a dielectric layer of $Pb(Zr,Ti)O_3$ was formed with a Zr/Ti ratio of 40/60 by a pulsed MO-CVD method with a thickness of 200 nm at a substrate temperature of 500° C. In an XRD measurement, the dielectric layer had a {100} crystalline orientation, with a (001) orientation of 80% or higher. Also the SRO and LNO perovskite type oxide conductive layers had a (100) orientation.

Then SRO of a thickness of 100 nm was formed as an upper electrode, thereby completing a dielectric member of the invention. In electrical measurements, it showed satisfactory characteristics of a residual polarization of 38 $\mu C/cm^2$ and a coercive electric field of 68 kV/cm, sufficient for a ferroelectric memory.

Example 2

After a surface of a Si (100) substrate was treated with hydrofluoric acid, a Y-doped $ZrO_2$ layer was formed by sputtering with a thickness of 100 nm at a substrate temperature of 800° C., and then a $CeO_2$ layer was formed with a thickness of 60 nm at a substrate temperature of 580° C. Both were (100) epitaxial layers. Then a SRO/LNO laminated structure was formed thereon with substrate temperatures respectively of 250° C. (LNO) and 600 μC. (SRO). Then a PZT layer was formed by sputtering with a thickness of 200 nm at a substrate temperature of 600° C. The PZT layer was a (001) oriented epitaxial layer. An evaluation of electrical characteristics as in Example 1 showed satisfactory results of a residual polarization of 40 $\mu C/cm^2$ and a coercive electric field of 72 kV/cm.

Example 3

Figure 10:
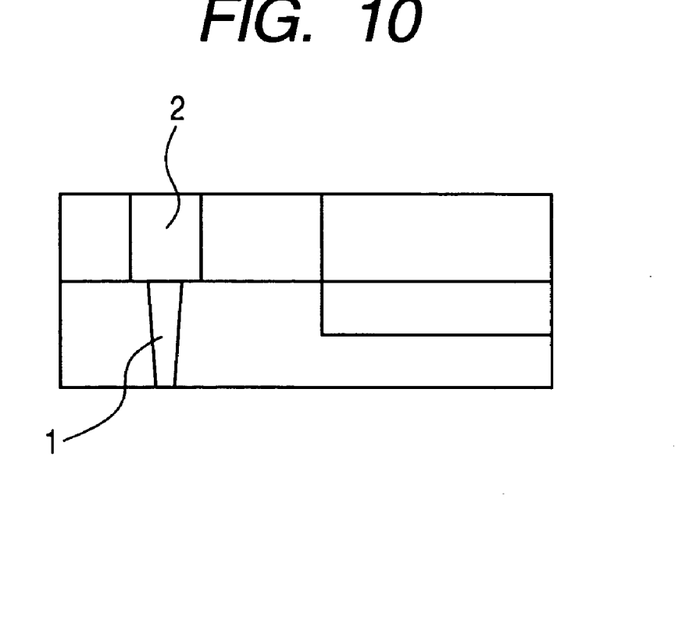
FIG. 10 is a cross-sectional view of a substrate having a communicating hole and a discharge port.

In the following there will be explained an example of a piezoelectric member of the invention. On a Si (110) substrate of a thickness of 200 μm, a SiN layer was formed by sputtering with a thickness of 1.5 μm. Then a Ti anchor layer of a thickness of 5 nm and an Ir electrode of a thickness of 50 nm were formed by rf-sputtering. The Ir layer had a (111) orientation with a half-peak width of 0.53°. Then, in a same method, a first oxide conductive layer of LNO (100) was formed with a thickness of 100 nm at a substrate temperature of 250° C. Then an SRO (100) layer of a thickness of 100 nm and a Pb(Zr,Ti)O$_3$ {100} layer with a Zr/Ti ratio of 53/47 as a piezoelectric layer of a thickness of 2.2 µm were formed thereon. Then SRO was formed as an upper electrode, and the piezoelectric layer was patterned into plural units with a width of 45 µm and a length of 3 mm, and the Si substrate was partially eliminated by wet etching to form individual liquid chambers of a width of 58 µm and a length of 3.2 mm. A piezoelectric member having a cross section as shown in FIG. 3 was obtained by individual patterning. Thus there was formed a device with a pitch of 84 µm of the discharge ports. In this process, the spontaneous oriented metal layer functioned sufficiently as an etching stop layer. A voltage of 20 V applied on this device provided a satisfactory displacement of 0.13 µm. A SUS substrate shown in FIG. 10, having communicating holes 2, discharge ports 1 and ink supply paths, was adjoined to the device to obtain an ink jet head of the invention. On this device, satisfactory liquid droplet discharge was confirmed under a driving voltage of 20 V. Also difference in the characteristics was small among the plural discharge ports and between the devices.

Example 4

In the following, there will be explained a producing method for an ink jet head, different from the method of Example 3. On a spontaneous oriented Pt metal layer (100 nm) on a Si (100) substrate, a first perovskite type oxide conductive layer of LaCoO$_3$ (100) of a thickness of 150 nm was formed, and a Pb(Zr,Ti)O$_3$ layer with a Zr/Ti ratio of 50/50 of a thickness of 3.0 µm was formed. The layer formations were conducted with substrate temperatures of T1 of 250° C., T2 of 650° C. and T3 of 520° C. On such piezoelectric layer, a Pt/Ti upper electrode was formed with a thickness of 200 nm and a SiN layer constituting a vibration plate was formed with a thickness of 2.0 µm. This substrate was adjoined, across an Au layer, to a second Si substrate worked to a state shown in FIG. 7E at 250° C. After the adjoining, the Si (100) substrate was eliminated by an alkaline etching. The first and second electrode layers were patterned by ICP, and the piezoelectric layer was patterned with a mixed acid etchant to leave a piezoelectric layer on the individual liquid chamber. Then a SUS plate bearing discharge ports of 20 µm in diameter was adjoined to obtain an ink jet head of the present invention. The evaluated discharge characteristics were similar to those in Example 3. The dielectric layer had an orientation (100) of 82%.

Also a device of similar characteristics was obtained by a preparation employing a Si (110) substrate as the first substrate.

Example 5

On an SOI substrate bearing an epitaxial Si layer of a thickness of 500 nm and a SiO$_2$ layer of a thickness of 500 nm, there were formed, by sputtering, a Pr-doped ZrO$_2$ (100) layer of a thickness of 150 nm and a CeO$_2$ (100) layer of a thickness of 250 nm as in Example 2. Then conductive layers were formed as a LaNiO$_3$ (100) layer of a thickness of 100 nm at a substrate temperature of 280° C. and a CaRuO$_3$ layer of a thickness of 100 nm at a substrate temperature of 620° C., and a PZT (001) layer (Zr/Ti=52/48) was formed thereon with a thickness of 2.6 µm. The PZT had an orientation of 99% or higher. After an actuator portion was patterned, the Si substrate in a handling layer was etched off by ICP to form a plurality of individual liquid chambers as pressure chambers, and a substrate bearing discharge ports was adjoined to obtain an ink jet head. In an evaluation, the head showed a displacement satisfactorily responsive to a driving signal, with sufficient liquid discharge speed.

This application claims priority from Japanese Patent Application No. 2004-094597 filed on Mar. 29, 2004, which is hereby incorporated by reference herein.

What is claimed is:

1. A dielectric member comprising, on a substrate, a lower electrode, a {100} oriented dielectric layer, and an upper electrode;
   wherein at least either of the electrodes has an at least two-layered structure constituted of ABO$_3$ type perovskite type oxide conductive layers, and all layers of the multi-layered structure have a {100} orientation, and wherein a layer distal to the dielectric layer has Ni or Co in B-site and a layer close to the dielectric layer has Sr, Ca or Ba in A-site and Ru in B-site.

2. The dielectric member according to claim 1, wherein the dielectric layer is constituted of an ABO$_3$ type perovskite oxide.

3. The dielectric member according to claim 1, wherein the {100} oriented dielectric layer has a (001) crystalline orientation by 50% or higher.

4. The dielectric member according to claim 3, wherein the {100} oriented dielectric layer has a (001) crystalline orientation by 80% or higher.

5. The dielectric member according to claim 1, wherein the layer distal to the dielectric layer is an oxide of a CNiO$_3$ type, wherein C is at least an element selected from La, Pr, Nd, Sm and Eu.

6. The dielectric member according to claim 1, wherein the layer distal to the dielectric layer has a rhombohedral crystal structure.

7. The dielectric member according to claim 1, wherein the layer distal to the dielectric layer is constituted of a compound containing La in an A-site.

8. A piezoelectric member comprising a dielectric member according to claim 1.

9. An ink jet head comprising a piezoelectric member according to claim 8.

10. An ink jet recording apparatus utilizing an ink jet head according to claim 9.

* * * * *